United States Patent
Seo et al.

(10) Patent No.: US 8,745,469 B2
(45) Date of Patent: *Jun. 3, 2014

(54) SIGNAL SEGMENTATION METHOD AND CRC ATTACHMENT METHOD FOR REDUCING UNDETECTED ERROR

(75) Inventors: Dongyoun Seo, Seoul (KR); Bong Hoe Kim, Ansan-si (KR); Young Woo Yun, Seoul (KR); Daewon Lee, Suwon-si (KR); Nam Yul Yu, Anyang-si (KR); Ki Jun Kim, Seoul (KR); Dongwook Roh, Seoul (KR)

(73) Assignee: LG Electronics Inc., Seoul (KR)

( * ) Notice: Subject to any disclaimer, the term of this patent is extended or adjusted under 35 U.S.C. 154(b) by 394 days.

This patent is subject to a terminal disclaimer.

(21) Appl. No.: 13/039,252

(22) Filed: Mar. 2, 2011

(65) Prior Publication Data

US 2011/0154154 A1    Jun. 23, 2011

Related U.S. Application Data

(63) Continuation of application No. 12/841,127, filed on Jul. 21, 2010, which is a continuation of application No. 12/206,540, filed on Sep. 8, 2008, now Pat. No. 7,793,194.

(60) Provisional application No. 60/970,936, filed on Sep. 8, 2007, provisional application No. 60/971,569, filed on Sep. 11, 2007, provisional application No. 60/971,922, filed on Sep. 13, 2007.

(30) Foreign Application Priority Data

Nov. 30, 2007 (KR) .......................... 10-2007-0123438

(51) Int. Cl.
*H03M 13/00* (2006.01)

(52) U.S. Cl.
USPC ........................................... 714/776; 714/758

(58) Field of Classification Search
USPC .................................................. 714/776, 758
See application file for complete search history.

(56) References Cited

U.S. PATENT DOCUMENTS

| 4,872,157 | A | | 10/1989 | Hemmady et al. |
| 5,237,593 | A | * | 8/1993 | Fisher et al. .................. 375/367 |
| 5,321,754 | A | | 6/1994 | Fisher et al. |
| 5,703,882 | A | * | 12/1997 | Jung et al. ..................... 370/474 |
| 5,844,918 | A | * | 12/1998 | Kato ............................. 714/751 |

(Continued)

FOREIGN PATENT DOCUMENTS

| JP | 06232850 | 8/1994 |
| KR | 1020010035772 | 5/2001 |

(Continued)

*Primary Examiner* — M. Mujtaba K Chaudry
(74) *Attorney, Agent, or Firm* — Lee, Hong, Degerman, Kang & Waimey

(57) ABSTRACT

The present invention provides for applying a cyclic redundancy check (CRC) to a data signal. The present invention includes attaching a first CRC to a first data signal block having a first length, segmenting the first data signal block attached with the first CRC into a plurality of second data signal blocks having a length shorter than the first length, respectively generating a second CRC for each second data signal block, and attaching the generated second CRC to the respective second data signal block. Moreover, the first CRC and second CRC may be generated from respectively different CRC generating polynomial equations.

12 Claims, 12 Drawing Sheets

(56) References Cited

U.S. PATENT DOCUMENTS

| | | |
|---|---|---|
| 6,006,321 A | 12/1999 | Abbott |
| 6,349,138 B1 * | 2/2002 | Doshi et al. .................. 380/200 |
| 6,438,724 B1 | 8/2002 | Cox et al. |
| 6,446,234 B1 | 9/2002 | Cox et al. |
| 6,609,226 B1 | 8/2003 | Figueira |
| 6,647,518 B1 * | 11/2003 | Asmanis ....................... 714/707 |
| 6,775,302 B1 | 8/2004 | Shaffer et al. |
| 6,820,230 B2 | 11/2004 | Sweeney |
| 6,944,348 B2 | 9/2005 | Kajita |
| 2007/0049990 A1 * | 3/2007 | Klostermann et al. .......... 607/60 |

FOREIGN PATENT DOCUMENTS

| | | |
|---|---|---|
| KR | 1020010048181 | 6/2001 |
| KR | 1020030032394 | 4/2003 |
| KR | 1020050045745 | 5/2005 |

* cited by examiner

SIGNAL SEGMENTATION METHOD AND CRC ATTACHMENT METHOD FOR REDUCING UNDETECTED ERROR

CROSS-REFERENCE TO RELATED APPLICATIONS

This application is a continuation of U.S. patent application Ser. No. 12/841,127, filed on Jul. 21, 2010, currently pending, which is a continuation of U.S. patent application Ser. No. 12/206,540, filed on Sep. 8, 2008, now U.S. Pat. No. 7,793,194, which claims the benefit of earlier filing date and right of priority to Korean Application No. 10-2007-0123438, filed on Nov. 30, 2007, and also claims the benefit of U.S. Provisional Application Nos. 60/970,936, filed on Sep. 8, 2007, 60/971,569, filed on Sep. 11, 2007, and 60/971,922, filed on Sep. 13, 2007, the contents of which are all hereby incorporated by reference herein in their entirety.

FIELD OF THE INVENTION

The present invention relates to applying cyclic redundancy check (CRC) by segmenting a signal block having a length into at least one signal block with a shorter length, and more specifically, to reducing undetected error probability according to each CRC when attaching the CRC.

BACKGROUND OF THE INVENTION

Transmission efficiency and reliability are important issues related to data transmission. Generally, various methods such as data segmentation and transmission and use of an error detecting code for determining the existence of data errors have been previously used to increase transmission efficiency and reliability.

Among these methods, error control is a mechanism for detecting and correcting errors generated during the data transmission. The error control method includes an automatic retransmission request (ARQ) method, a forward error correction (FEC) method, a backward error correction (BEC) method, and the like.

A cyclic redundancy check (CRC) method is an error detection method that transmits results extracted by a polynomial from data transmitted from a transmitting side. The CRC includes a redundant error checking field and checks errors by comparing results extracted by the same method from a receiving side. The CRC is a powerful technology and can be easily implemented by hardware.

In one example of the CRC, an original data frame to be transmitted from the transmitting side is divided by a CRC polynomial to produce remainder values. The remainder values comprise the error checking field. Hence, in order to generate the error checking field, the CRC polynomial is used as a divisor. The error checking field is transmitted by being attached to an original signal block to be accurately divided by a predefined polynomial, wherein a result signal block (original data+error checking field) is predefined. Herein, the predefined polynomial is referred to as the divisor or the CRC polynomial. Also, for convenience of explanation, the attachment of the aforementioned error checking field is referred to as the attachment of the CRC, and the error checking field attached to the original signal block is referred to as the CRC.

For the transmitted signal, the receiving side receives the result signal block and performs the CRC check. The receiving side checks the remainder produced by dividing the received signal block by a CRC polynomial, such as the one used in transmitting the received signal block. Error detection in the receiving side detects errors by checking whether the remainder is "0" when the data transmitted along with the remainder in the receiving side is divided by the CRC polynomial dividing the original data. Accordingly, if the remainder is not "0", a transmission error is judged to have occurred.

In order to increase data transmission efficiency, various methods for segmenting and transmitting data exist. However, a 3rd generation partnership project (3GPP) system will be described below, for example.

FIGS. 1 and 2 are schematic views for explaining a process that segments a transport block having a long length into code blocks having a short length, and attaching the CRC, in the 3GPP system. The 3GPP system segments a transport block (TB) having a long length into code blocks (CBs) having a short length, performs a coding process on each of the plurality of code blocks having the short length, and transmits a combination thereof.

Referring to FIG. 1, after a transport block having a long length is subjected to the CRC coding process, the CRC is attached to the transport block (S101). Thereafter, the entire transmission block attached with the CRC is segmented into a plurality of code blocks having a short length (S102). Referring to FIG. 2, attachment of the CRC to the transport block and subsequent segmentation into a plurality of code blocks is illustrated with reference to numerals 201 to 203.

Referring again to FIG. 1, each of the plurality of code blocks having the short length is also subjected to the CRC coding process and CRC attachment process (S103). As shown in numeral 204 of FIG. 2, each code block includes the CRC. Each code block attached with a CRC is then input into a channel encoder and subjected to a channel coding process (S104). Thereafter, each code block is subjected to a rate matching process (S105) and a code block junction and channel interleaving process (S106). Finally, each code block is transmitted to the receiving side.

However, a structure of a signal block having a long length, such as a transport block, which includes signal blocks having a short length, such as code blocks, as in the 3GPP system, for example, may be problematic.

For example, errors undetected by the CRC for the signal block having the short length may occur in the receiving signal. Thus, there may be an error corresponding to the remainder "0" upon dividing the receiving signal by the CRC generating equation in the receiving side as described above. Moreover, the error undetected by the CRC for the signal block having the short length may not be detected by the CRC for the signal block having the long length, which includes the signal block having the short length. Accordingly, although the signal block having the long length is segmented into signal blocks having the short length and the CRC is attached at each step, there exists an undetected error pattern at both signal blocks.

SUMMARY OF THE INVENTION

The present invention is directed to applying a cyclic redundancy check (CRC) to a data signal.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention is embodied in a method for applying a cyclic redundancy check (CRC) to a data signal, the method comprising attaching a first CRC to a first data signal block having a first length, segmenting the first data signal block attached with the first CRC into a plurality of second data signal blocks having a length shorter than the first length, respectively generating a second CRC for each second data signal block, and attaching the generated second CRC to the respective second data signal block, wherein the first CRC and second CRC are generated from respectively different CRC generating polynomial equations.

In accordance with another embodiment of the present invention, a system for applying a cyclic redundancy check (CRC) to a data signal comprises a processor attaching a first CRC to a first data signal block having a first length, segmenting the first data signal block attached with the first CRC into a plurality of second data signal blocks having a length shorter than the first length, respectively generating a second CRC for each second data signal block, and attaching the generated second CRC to the respective second data signal block, wherein the processor generates the first CRC and second CRC from respectively different CRC generating polynomial equations.

In accordance with another embodiment of the present invention, a method for applying a cyclic redundancy check (CRC) to a data signal comprises attaching a first CRC to a first data signal block having a first length, segmenting the first data signal block attached with the first CRC into a plurality of second data signal blocks having a length shorter than the first length, wherein the first CRC is attached to one of the plurality of second data signal blocks, respectively generating a second CRC for each second data signal block, and attaching the generated second CRC to the respective second data signal block such that one of the plurality of second data signal blocks has an attached first CRC and second CRC, wherein the first CRC and second CRC are generated from respectively different CRC generating polynomial equations.

Preferably, the first data signal block is a transport block and the second data signal block is a code block. Preferably, the first CRC and the second CRC have a 24-bit length. Preferably, the CRC generating polynomial equations respectively generating the first CRC and second CRC are 24th order polynomial equations. Preferably, the CRC generating polynomial equations respectively generating the first CRC and second CRC satisfy a reciprocal polynomial relation with each other.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. Features, elements, and aspects of the invention that are referenced by the same numerals in different figures represent the same, equivalent, or similar features, elements, or aspects in accordance with one or more embodiments.

DETAILED DESCRIPTION OF THE PREFERRED EMBODIMENTS

Figure 1:
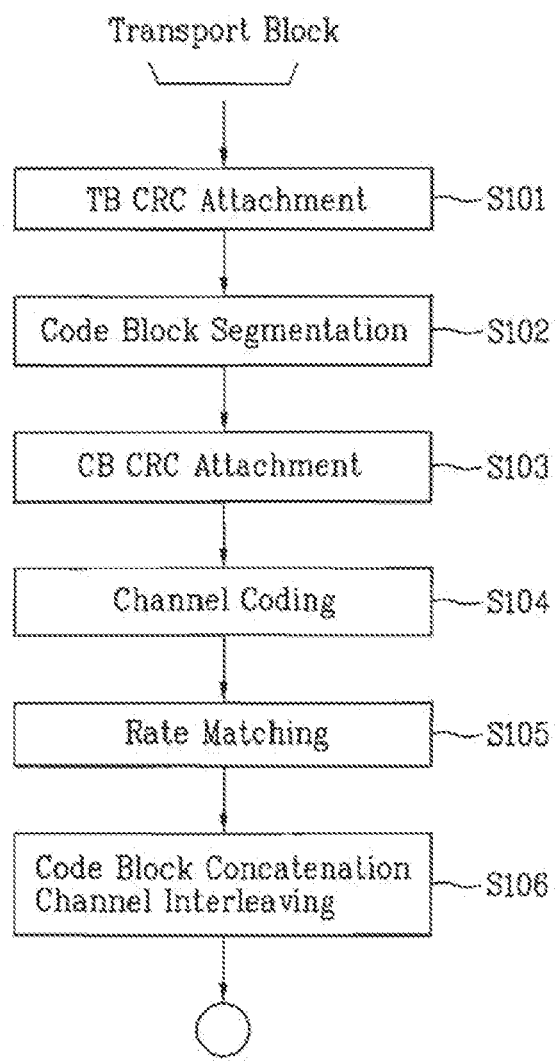
FIG. 1 is a flow diagram for explaining a method of segmenting a transport block having a length into code blocks having a shorter length and attaching a cyclic redundancy check (CRC).
Figure 2:
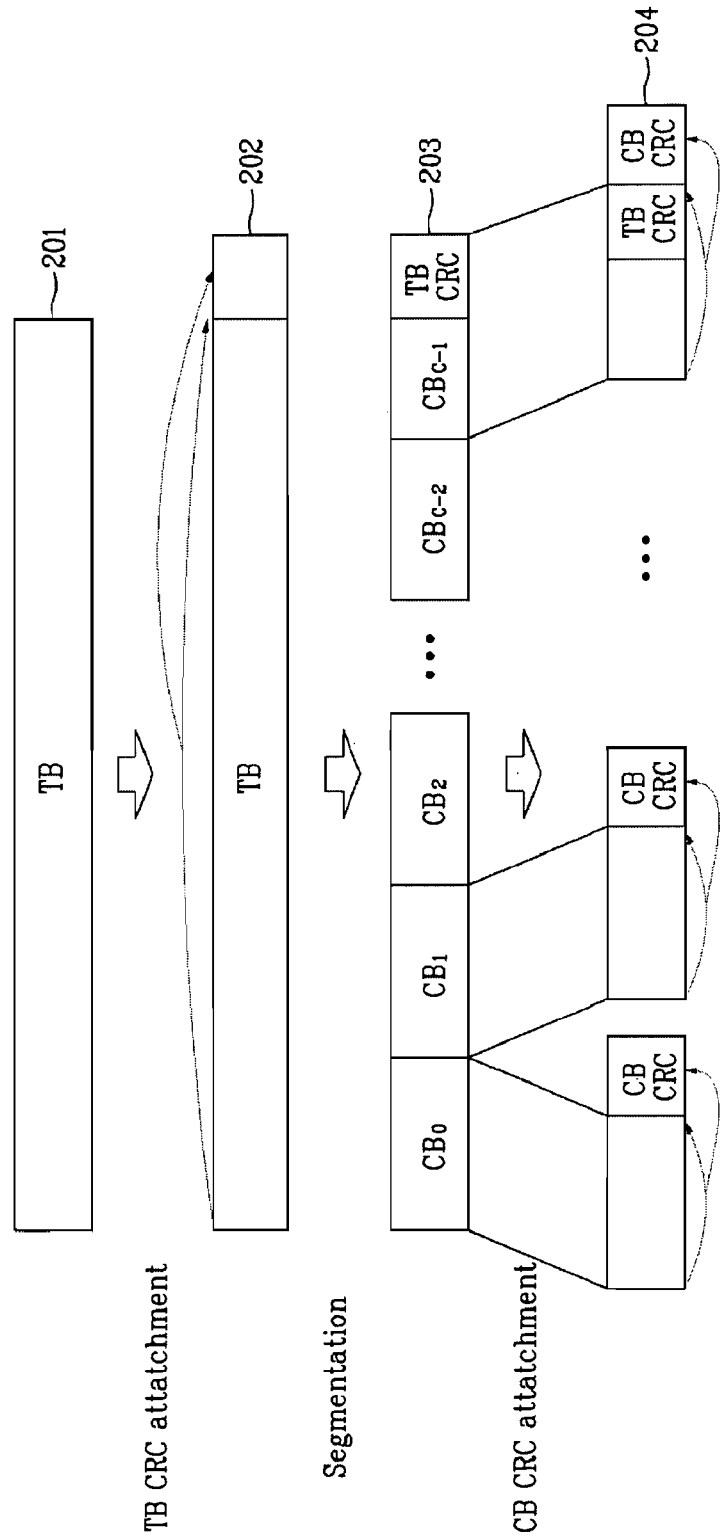
FIG. 2 is a schematic illustrating a method of segmenting a transport block having a length into code blocks having a shorter length and attaching a cyclic redundancy check (CRC).

The present invention relates to applying a cyclic redundancy check (CRC) to a data signal.

Hereinafter, preferred embodiments of the present invention will be described with reference to the accompanying drawings. The detailed description to be described later along with the accompanying drawings explains illustrative embodiments of the present invention, but is not limited thereto.

The detailed description to be described later includes concrete details to provide a complete understanding of the present invention. However, those skilled in the art can perform the present invention without the detailed description. In some cases, the known structure and apparatus will be omitted or the key functions of each structure and apparatus are shown in a block form, to avoid the obscurity of the inventive concept. Also, like components are denoted by like reference numerals throughout the specification.

As described above, the present invention provides a method for reducing undetected error probability due to each CRC when the CRC is attached to a first data signal block having a length and a second data signal block having a shorter length, which is segmented from the first data signal. To this end, the aforementioned CRC is mathematically reviewed in more detail. Moreover, causes of the undetected error pattern having a detrimental effect on both the first data signal and second data signal block are reviewed. Thereafter, a solution thereto is provided.

A general CRC will now be explained. Assume that an information length of any one signal block is k and a CRC with a length L is applied to the information block. If a CRC generating polynomial for generating the CRC with the length L is $g(x)$, an order of $g(x)$ is L. Meanwhile, if information with the length k is represented by a polynomial, it can be represented by a k−1 order of the polynomial. The information polynomial may be $m(x)$. Moreover, if a final transmitted length is n, a relation of n=k+L is satisfied.

A process for attaching the CRC to the information polynomial m(x) will now be explained. First, multplying the information polynomial m(x) by an order of the CRC generating polynomial g(x) may be represented by a(x) in Equation (1) as follows.

$$a(x) = m(x) * x^L \qquad (1)$$

Herein, if a quotient and a remainder produced by dividing a(x) by the L-order CRC generating polynomial are q(x) and p(x), a(x) can represented by Equation (2).

$$a(x) = m(x) * x^L - q(x) * g(x) + p(x) \qquad (2)$$

Accordingly, using the relationships described above, b(x) may be defined for when the remainder p(x) is subtracted from a(x) to change a(x) into a product form of the CRC generating polynomial g(x). Thus, b(x) can be represented by Equation (3) as follows.

$$\begin{aligned} b(x) &= m(x) * x^L - p(x) \\ &= m(x) * x^L + p(x) \\ &= q(x) * g(x) \end{aligned} \qquad (3)$$

In Equation (3), the minus (−) operation is a binary operation and is equivalent to the plus (+) operation. Therefore, b(x) may be represented using the plus (+) operation. Moreover, q(x) is a polynomial with a k−1 order or more. In Equation (3), an actually transmitted signal is b(x). Therefore, Equation (3) represents a form that the transmitted signal b(x) is transmitted by an addition of p(x) corresponding to the remainder values using the CRC generating polynomial to the message signal m(x).

A method for detecting an error using the CRC at a receiving side receiving the signal b(x) transmitted from the transmitting side as described above will now be explained. Generally, the receiving side judges whether there is an error using the remainder produced by dividing the received signal b(x) by the CRC generating polynomial g(x). Thus, if no errors are generated in a channel, then because the signal b(x) is a product form of the CRC generating polynomial g(x), dividing b(x) by g(x) will produce a remainder of 0. The case where no error exists in the received signal can be represented by Equation (4).

$$\begin{aligned} b(x)/g(x) &= q(x) * g(x)/g(x) \\ &= q(x) + 0 \end{aligned} \qquad (4)$$

However, if the received signal b(x) is transmitted and an error e(x) represented by a polynomial that is not 0 in the channel occurs, a received signal $b_E(x)$ can be represented by Equation (5).

$$\begin{aligned} b_E(x) &= b(x) + e(x) \\ &= m(x) * x^{n-k} + p(x) + e(x) \\ &= q(x) * g(x) + e(x) \end{aligned} \qquad (5)$$

If the erroneous received signal $b_E(x)$ is received, the receiving side easily detects the error by determining the remainder e(x) produced by dividing b(x) by g(x). However, there may exist an error signal, wherein the remainder is 0 upon determining the error e(x) generated in the channel using the CRC generating polynomial g(x). The error signal having a remainder 0 upon dividing the error e(x) generated in the channel by the CRC generating polynomial g(x) may be considered an undetected error signal, represented by $e_{UE}(x)$. Accordingly, the error detection process in the receiving side can be represented by Equation (6).

$$\begin{aligned} b_{UE}(x) &= b(x) + e_{UE}(x) \\ &= m(x) * x^L + p(x) + e_{UE}(x) \\ &= q(x) * g(x) + q_{UE}(x) * g(x) \\ &= q'(x) * g(x) \end{aligned} \qquad (6)$$

Thus, the undetected error $e_{UE}(x)$ can be defined by Equation (7).

$$e_{UE}(x) = q_{UE}(x) * g(x) \qquad (7)$$

In accordance with the present invention, $e_{UE}(x)$ exists in a product form of a polynomial, not g(x) or 0. Consequently, when the undetected error $e_{UE}(x)$ as described above occurs, the remainder produced by dividing the received signal $b_{UE}(x)$ by g(x) in the receiving side is 0. Thus, it may be appreciated that the error cannot be detected.

Hereinafter, the CRC relationship between a signal block having a length and a signal block having a shorter length is explained with regard to the aforementioned CRC generation and the undetected error.

For example, a long message block M(x) includes a short message block m(x). Herein, a position including the short message block m(x) may be in any portion of M(x). Also, an actually transmitted portion of M(x) is transmitted by first applying the CRC to the long message block. Thereafter, the long message block applied with the CRC is divided into short message blocks and a CRC is applied to each short message block. Therefore, the actually transmitted portion of M(x) is a continuous number of short message blocks having a respective CRC.

If the order of M(x) is K−1, the order of m(x) is k−1, and m(x) is included in a position spaced by Δ order from M(x) (i.e., represented by a form produced by $x^\Delta$ in a polynomial), then M(x) can be represented by Equation (8), wherein M'(x) represents a portion subtracting the short message block m(x) from the long message block M(x).

$$\begin{aligned} M(x) &= M_{K-1} x^{K-1} + \ldots + m(x) x^\Delta + \ldots + M_1 x^1 + M_0 \\ &= M'(x) + m(x) x^\Delta \end{aligned} \qquad (8)$$

If the CRC generating polynomial g(x) is applied to the long message block M(x), it may be represented by Equation (9).

$$\begin{aligned} B(x) &= M(x) * x^L + P(x) \\ &= Q(x) * g(x) \end{aligned} \qquad (9)$$

In order to change the transmitted signal into the product form of the CRC generating polynomial g(x), the remainder P(x) produced by dividing $M(x) * x^L$ by g(x) is subtracted from the Equation (9) (added since it is a binary operation). The result is represented by B(x).

If the CRC generating polynomial g(x) is applied to the short message block m(x), it may be represented by Equation (10).

$$b(x) = m(x) * x^L + p(x)$$

$$q(x) * g(x) \quad (10)$$

In order to change the transmitted signal into the product form of the CRC generating polynomial g(x), the remainder P(x) produced by dividing M(x)*x^L by g(x) is subtracted from the Equation (10) (added since it is a binary operation). The result is represented by b(x).

In accordance with the present invention, a case where an error occurs in a portion including a short message block in a transmission through a transmission channel will be described using the mathematical model. Since the short message block is included in a long message block, the error affects the CRC with the short block and the CRC with the long block. This is because an actually transmitted portion is a continuous number of short message blocks having a respective CRC.

As described above, the present invention reduces undetected error probability when attaching and transmitting the CRC to the long signal block and the short signal block. Thus, the cause of the undetected error in the transmission signal will be described.

Among others, the undetected error $e_{UE}(x)$ generated in the short block can be represented by the Equation (7) above so that the received signal can be represented by the Equation (6). For convenience, Equation (6) is presented again as Equation (11).

$$\begin{aligned} b_{UE}(x) &= b(x) + e_{UE}(x) \quad (11)\\ &= m(x) * x^L + p(x) + e_{UE}(x) \\ &= q(x) * g(x) + q_{UE}(x) * g(x) \\ &= q'(x) * g(x) \end{aligned}$$

The undetected error $e_{UE}(x)$ has an effect on the short signal block as well as the long signal block as described above. If the short signal block m(x) is included in a position spaced by Δ order from the long signal block M(x) (i.e., represented by a form produced by $x^\Delta$ in a polynomial), the undetected error $e_{UE}(x)$ also appears in a position spaced by Δ order in the long signal block. Therefore, it can be represented by Equation (12).

$$\begin{aligned} B_{UE}(x) &= B(x) + e_{UE}(x) * x^\Delta \quad (12)\\ &= Q(x) * g(x) + q_{UE}(x) * g(x) * x^\Delta \\ &= \{Q(x) + qUE(x) * x^\Delta\} * g(x) \\ &= Q'(x) * g(x) \end{aligned}$$

As can be appreciated from Equation (12), the signal block $B_{UE}(x)$ representing the long signal block has a remainder 0 produced by being divided by g(x). Thus, like the CRC for the short signal block, the error cannot be detected by the CRC for the long signal block.

A reason for why the CRC cannot detect the error for the signal block with the short length and the signal block with the long length is because the CRC for the signal block with the short length and the CRC for the signal block with the long length use the same CRC generating polynomial. In other words, in Equations 11 and 12, the CRC generating polynomial used for the signal block M(x) with the long length and the signal block m(x) with the short length is the same (g(x)). Thus, the error not detected by the CRC for the signal block with the short length is not also detected by the CRC for the signal block with the long length.

Therefore, in accordance with one embodiment of the present invention, when a signal block having a long length is segmented into signal blocks having a short length prior to transmission, a CRC generating polynomial is applied to the long signal block different from the CRC generating polynomial applied to the short signal blocks in order to detect any errors.

Another reason for why the CRC cannot detect the error for the signal block with the short length and the signal block with the long length is because the respective CRCs read the signal block with the short length and the signal block with the long length through a same pattern to generate the CRC.

Therefore, in accordance with another embodiment of the present invention, when generating the CRCs for the signal block having the short length and the signal block having the long length, a pattern for reading the short signal block is different from the pattern for reading the long signal block. This may be accomplished by applying interleaving, for example.

Hereinafter, embodiments of the present invention will be described. The following embodiments may be related to a 3GPP system, for example, wherein a signal block having long length is a transport block (TB) and a signal block having a short length is a code block (CB). However, references related to the 3GPP system are only examples to which the present invention is applied. It will be apparent to those skilled in the art that the principles of the present invention can be applied to any system attaching an error check code to a signal block having a long length using a CRC, segmenting the signal block having the long length attached with the CRC into signal blocks having a short length, and attaching the CRC to the respective segmented signal blocks prior to their transmission.

In accordance with one embodiment of the present invention, a method for improving performance of a 3GPP LTE (Long Term Evolution) system attaching a CRC to a transport block, segmenting the transport block attached with the CRC into a plurality of code blocks, attaching the CRC to each code block and transmitting each code block. Notably, when each CRC attached to the transport block and code block is generated by the same CRC generating polynomial, error patterns generating an undetected error for all transport blocks and code blocks are the same.

Therefore, in accordance with the present invention, different CRC generating polynomials are used when applying a CRC to a transport block and code block, respectively, so that the undetected error pattern is not the same for both the transport block and code block. In other words, if the two CRC generating polynomials are different, the undetected error pattern according to the transport block CRC and the undetected error pattern according to the code block CRC are different. Consequently, although an undetected error occurs in one block (e.g., transport block), the undetected error may be detected by the other block (e.g., code block).

A method for using different CRC generating polynomials at both blocks will now be described. First, a method constituting a transport block CRC and a code block CRC using completely different generating polynomials will be explained. For example, if a CRC with a 24-bit length is used, different types of CRC generating polynomials may be used, as shown in Equation (13), for example.

CRC Generating Polynomial of Transport Block:

$$g_{24A}(x)=x^{24}+x^{23}+x^{6}+x^{5}+x+1$$

CRC Generating Polynomial of Code Block:

$$g_{24B}(x)=x^{24}+x^{23}+x^{14}+x^{12}+x^{8}+1 \quad (13)$$

The two CRC generating polynomials described in Equation (13) are merely examples of polynomials capable of being used in case that both the transport block and the code block use a 24-bit CRC. In accordance with the present invention, polynomials corresponding to a CRC length (e.g. 24 bits), but different from the ones described in Equation (13) may be used to better CRC performance.

In accordance with one embodiment of the present invention, the CRC generating polynomial for the transport block and the CRC generating polynomial for the code block satisfy a reciprocal polynomial relationship. A reciprocal polynomial is a polynomial that converts coefficients with the highest order of any polynomial into coefficients with the lowest order. It further converts coefficients with the second-highest order into coefficients with the second-lowest order, and so on. By repeatedly applying the process, the reciprocal polynomial eventually converts the coefficients with the lowest order into the coefficients with the highest order.

The reciprocal polynomial relationship will be described with reference to the following example. A reciprocal polynomial $g^*(x)$ of $g(x)$ can be represented by Equation (14).

$$g(x)=g_L x^L+g_{L-1} x^{L-1}+\ldots+g_1 x+g_0$$

$$g^*(x)=g_0 x^L+g_1 x^{L-1}+\ldots+g_{L-1} x+g_L \quad (14)$$

Reciprocal polynomials satisfying the relationship of Equation (14) may be represented by Equation (15).

$$g^*(x)=g(x^{-1})x^L \quad (15)$$

In Equations (14) and (15), L represents the highest order of the polynomial $g(x)$, $g(x)$ and $g^*(x)$ may be any polynomials satisfying the relationship of Equation (15). However, a polynomial representing the characteristic of the greatest common divisor polynomial 1 is preferably selected.

As described above, problems related to the same undetected error pattern being present in both the transport block and code block may be solved by using $g(x)$ and $g^*(x)$, which have a reciprocal polynomial relationship with each other, as the CRC generating polynomials for the transport block and the code block, respectively. Notably, if the used CRC generating polynomial $g(x)$, or $g^*(x)$, does not have symmetrical coefficients with the other, then each polynomial satisfies a reciprocal polynomial relationship with a respectively different polynomial.

An example of CRC generating polynomials for the transport block and code block, which satisfy a reciprocal polynomial relationship as described above, is shown in Equation (16). Generally, in accordance with the present invention, two different CRC generating polynomials may be respectively used for the TB CRC and CB CRC. However, when using CRC generating polynomials that have a reciprocal polynomial relationship, the present invention may be thought of using only one CRC generating polynomial because a second CRC generating polynomial can be reciprocally derived from a first CRC generating polynomial.

CRC Generating Polynomial of Transport Block:

$$g_{24A}(x)=x^{24}+x^{23}+x^{6}+x+1$$

CRC Generating Polynomial of Code Block:

$$g_{24B}(x)=x^{24}+x^{23}+x^{19}+x^{18}+x+1 \quad (16)$$

In accordance with the present invention, the CRC generating polynomial for the transport block and the CRC generating polynomial for the code block may have different orders. Accordingly, the polynomial having better characteristics for each length may be selected.

A method for transmitting the signal by attaching the CRC to the transport block, segmenting the transport block attached with the CRC into at least one code block, and attaching the CRC to the respective segmented code blocks will now be described.

Figure 3:
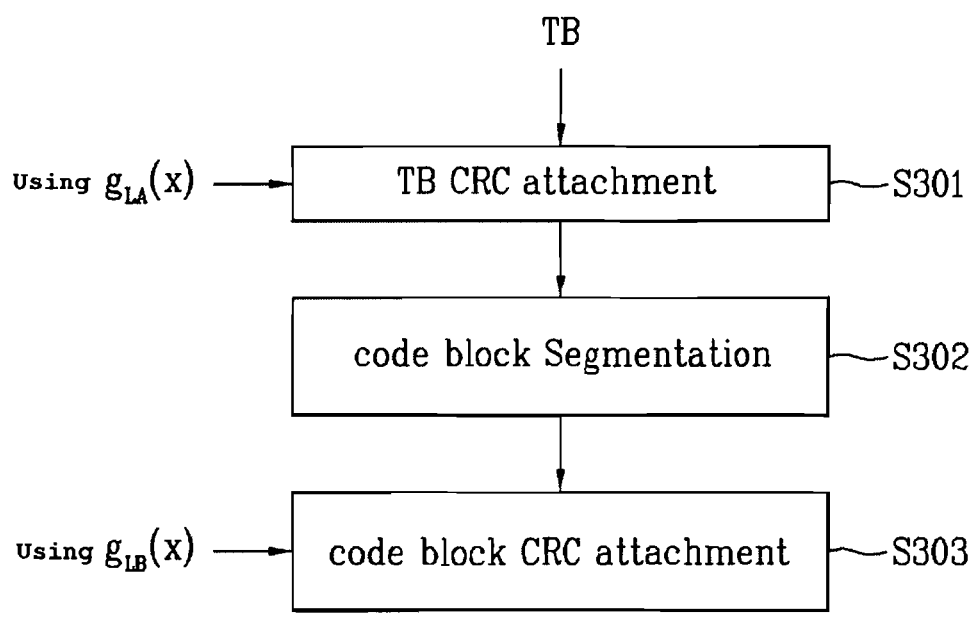
FIG. 3 illustrates a method for segmenting a transport block into at least one code block and attaching a CRC thereto in accordance with one embodiment of the present invention.

FIG. 3 illustrates a method for segmenting a transport block into at least one code block and attaching a CRC thereto in accordance with one embodiment of the present invention. Referring to FIG. 3, the transport block (TB) is attached with a first CRC (S301). At this time, if the input bit length of the transport block input to calculate the CRC is A and the attached CRC length is L, then the respective input bits can be represented by $a_0, a_1, a_2, a_3, \ldots, a_{A-1}$, and the parity bits attached through the CRC calculation can be represented by $p_0, p_1, p_2, p_3, \ldots, p_{L-1}$. Also, as described above, if the length of the transport block attached with the CRC is B, the relation B=A+L is satisfied and the transport block attached with the CRC is represented by $b_0, b_1, b_2, b_3, \ldots, b_{B-1}$.

Meanwhile, at S301, a CRC generating polynomial used in the CRC generation is $g_{LA}(x)$. This CRC generating polynomial is different from a CRC generating polynomial $g_{LB}(x)$ used in the CRC generation of the code block. If both polynomials use a CRC with a 24-bit length, the CRC generating polynomial for the transport block is represented by $g_{24A}(x)$ and the CRC generating polynomial for the code block is represented by $g_{24B}(x)$.

Thereafter, the transport block with the first CRC attached is segmented into at least one code block (S302). In the aforementioned 3GPP LTE system, code block segmentation is performed when the number of input bits is larger than the size (Z) of the maximum code block. If the number of input bits is smaller than the size of the maximum code block, the code block segmentation is not performed. If the code block segmentation is not performed, then the code block may not be subject to a separate CRC adding process. However, the present embodiment addresses the case where the transport block is segmented into the at least one code block and the separate CRC is attached to each code block. Therefore, the case where the length of the transport block is longer than the size (Z) of the maximum code block will be described.

At S302, when the transport block is segmented into the at least one code block, the number of segmented code blocks may be represented by Equation (17).

$$C=[B/(Z-L)] \quad (17)$$

Referring to Equation (17), the number of segmented code blocks C may be found by dividing the length of the input bit B by the maximum code block length Z. However, the method for calculating the number of segmented code blocks C may also consider the length L of a CRC added to each code block rather than just simply dividing by the length of the maximum code block Z.

After segmenting the transport block with the first CRC attached into code blocks, a second CRC with a length L is attached to each code block (S303). In accordance with the present invention, the second CRC attached to each code block uses a CRC generating polynomial different from the CRC generating polynomial used for the transport block as described above. The CRC generating polynomial used for the second CRC is represented by $g_{LB}(x)$. If the second CRC length attached to each code block is 24 bits, the generating polynomial generating the second CRC may be represented by $g_{24B}(x)$. Preferably, the polynomial generating the first CRC attached to the transport block and the polynomial generating the second CRC attached to each code block are set differently so that an error not detected by one CRC can be detected by the other CRC.

In accordance with another embodiment of the present invention, if a CRC is generated according to the same pattern using the same CRC generating polynomial in the transport block and the code block as described above, an error pattern generating an undetected error is the same in the transport block and the code block. To overcome this problem, when the undetected error pattern is read in the transport block and the code block, it may be read using different patterns. In other words, although the undetected error pattern is the same due to the use of the same CRC generating polynomial at both blocks, when reading data for an actual CRC generation, the data is read in different patterns at each block. Thus, the problem of the undetected error pattern due to the use of the same CRC generation polynomial is solved.

Preferably, when reading a message at a time of the CRC generation at any one of the transport block and the code block, an order of reading in the message may be changed by passing the message through an interleaver, for example. Accordingly, when the message passes through the interleaver, its order is changed by the interleaver so that the order having an effect on the undetected error pattern is changed according to the order of the interleaver. Therefore, the same error pattern cannot be recognized as an undetected error pattern at both the transport block and code block.

In accordance with the present invention, when a data structure enters into an input of a channel encoder, as in FIG. 1 for example, a method for making the pattern of the code block different from the pattern of the transport block may be realized.

Figure 4:
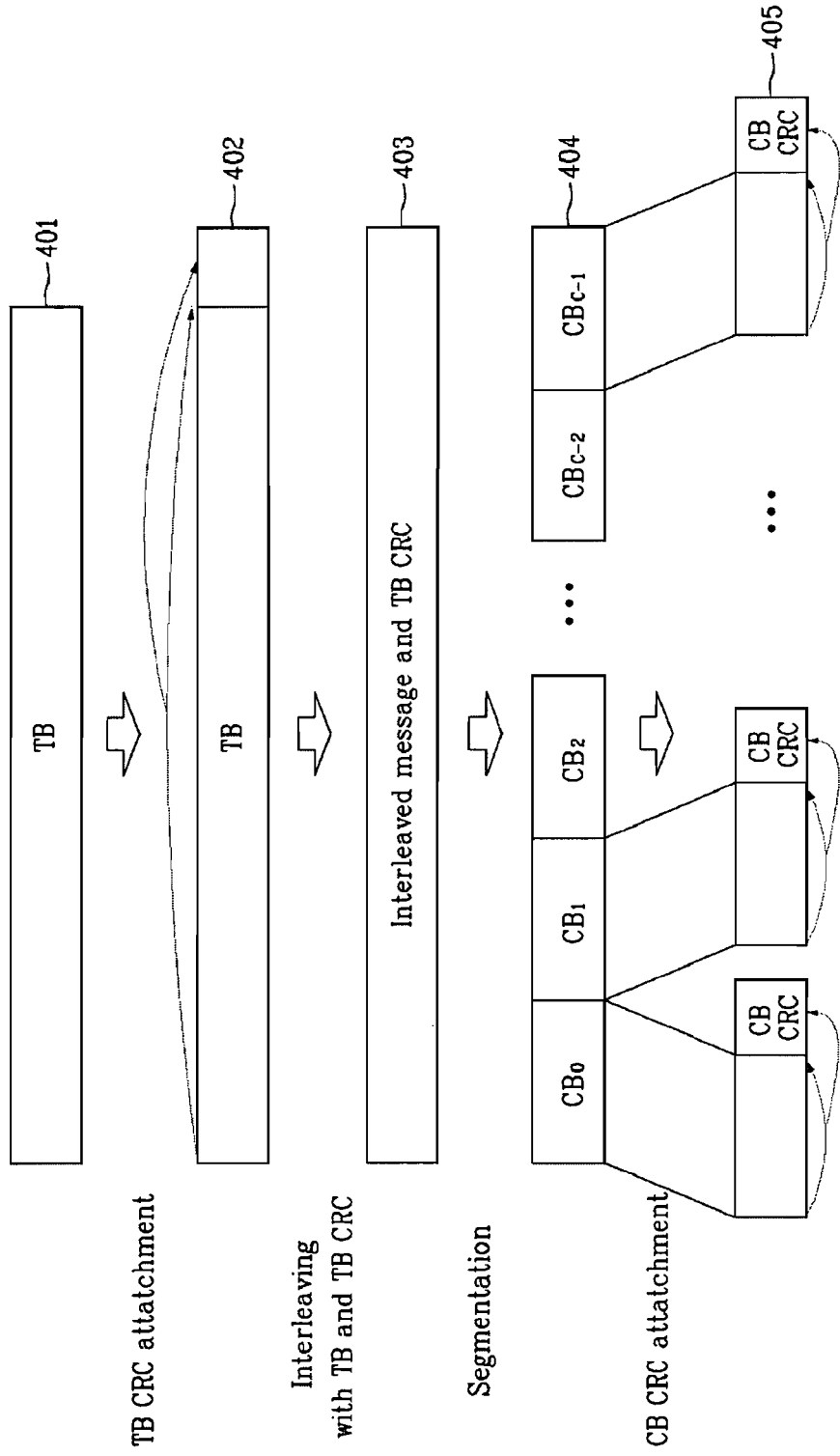
FIGS. 4 and 5 illustrate methods for reducing an undetected error pattern in a transport block and code block in accordance with embodiments of the present invention.
Figure 5:
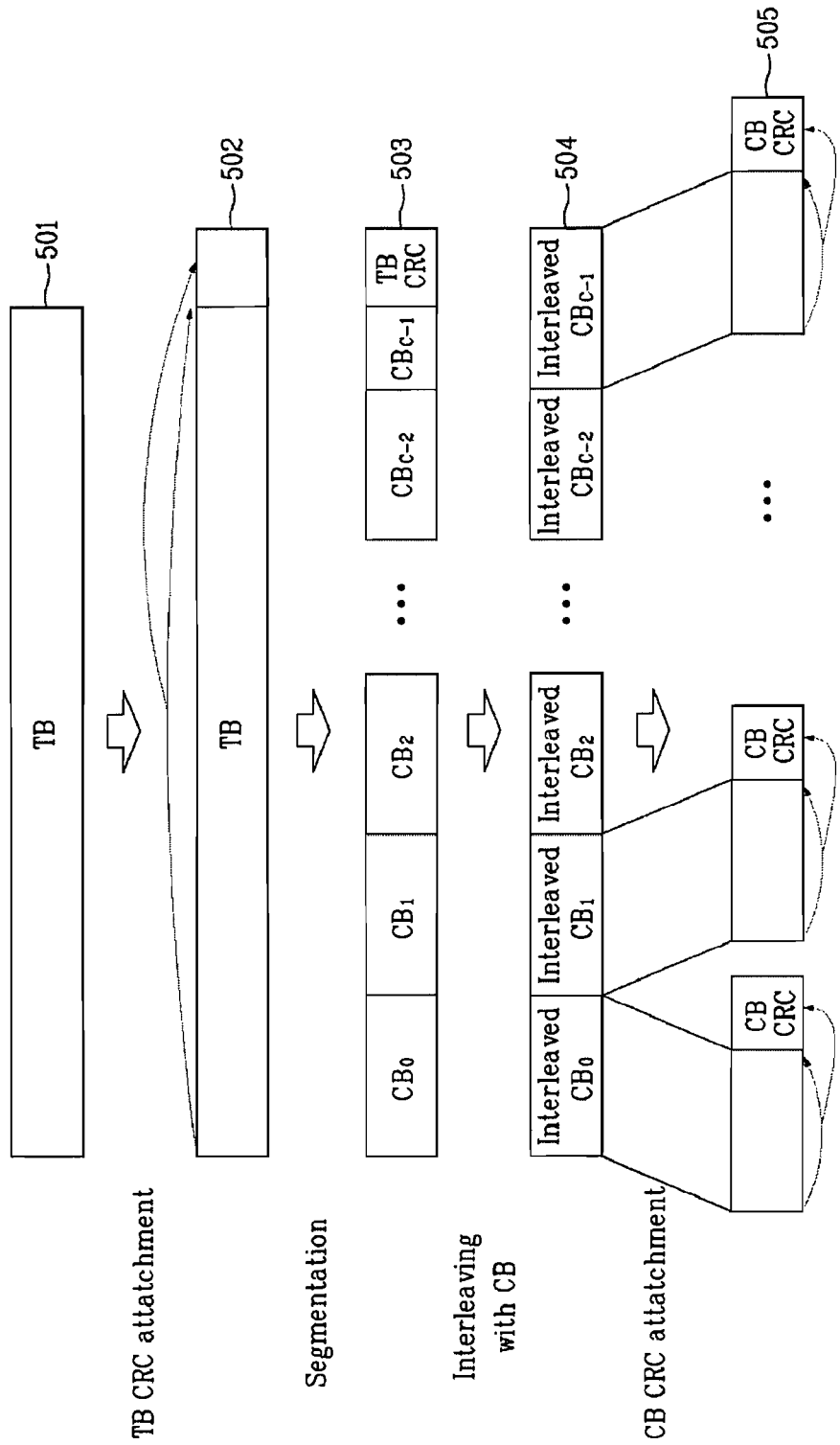

FIGS. 4 and 5 illustrate methods for reducing an undetected error pattern in a transport block and code block in accordance with embodiments of the present invention.

Referring to FIG. 4, transport blocks are received, wherein a transport block 401 is read according to a received order to generate a first CRC. A transport block 402 attached with the first CRC is then formed. Thereafter, an interleaved transport block 403 is formed by interleaving all transport blocks 402 attached with the first CRC. The interleaved transport block 403 is then segmented into a plurality of code blocks 404. A second CRC generated according to an order of a respective segmented code block is then attached to each code block to form code blocks 405 respectively attached with the second CRC. Preferably, when generating the second CRC for the code block, the second CRC is generated according to an order of the interleaved code blocks so that the second CRC has undetected error patterns different from the first CRC.

FIG. 5 illustrates an alternative method for attaining results similar to FIG. 4. In FIG. 5, transport blocks are received, wherein a transport block 501 is read according to a received order to generate a first CRC. A transport block 502 attached with the first CRC is then formed. Thereafter, the transport block 502 attached with the first CRC is segmented into a plurality of code blocks 503. A plurality of interleaved code blocks 504 may then be formed by interleaving the segmented code blocks 503. Thereafter, each interleaved code block 504 is attached with a second CRC generated according to the interleaved order to form code blocks 505 respectively attached with the second CRC.

In the examples of FIGS. 4 and 5, an order for attaching the generated first CRC and/or second CRC to the transport block and/or code block depends on an order of the CRC generation. However, an attachment method wherein a most significant bit (MSB) is inverted into a least significant bit (LSB) may also be used.

In accordance with the present invention, in order to further solve the problem of the same undetected error pattern being present in both the transport block and code block, the transport block and code block may be passed to different interleavers. Notably, a purpose of an interleaver is to make the read order of the transport block and code block different from each other in order to differ their respective CRC generation. Therefore, a first CRC may be generated after passing a transport block to a transport block interleaver, and a second CRC may be generated after passing a code block to a code block interleaver. Preferably, the transport block interleaver is different from the code block interleaver.

Figure 6:
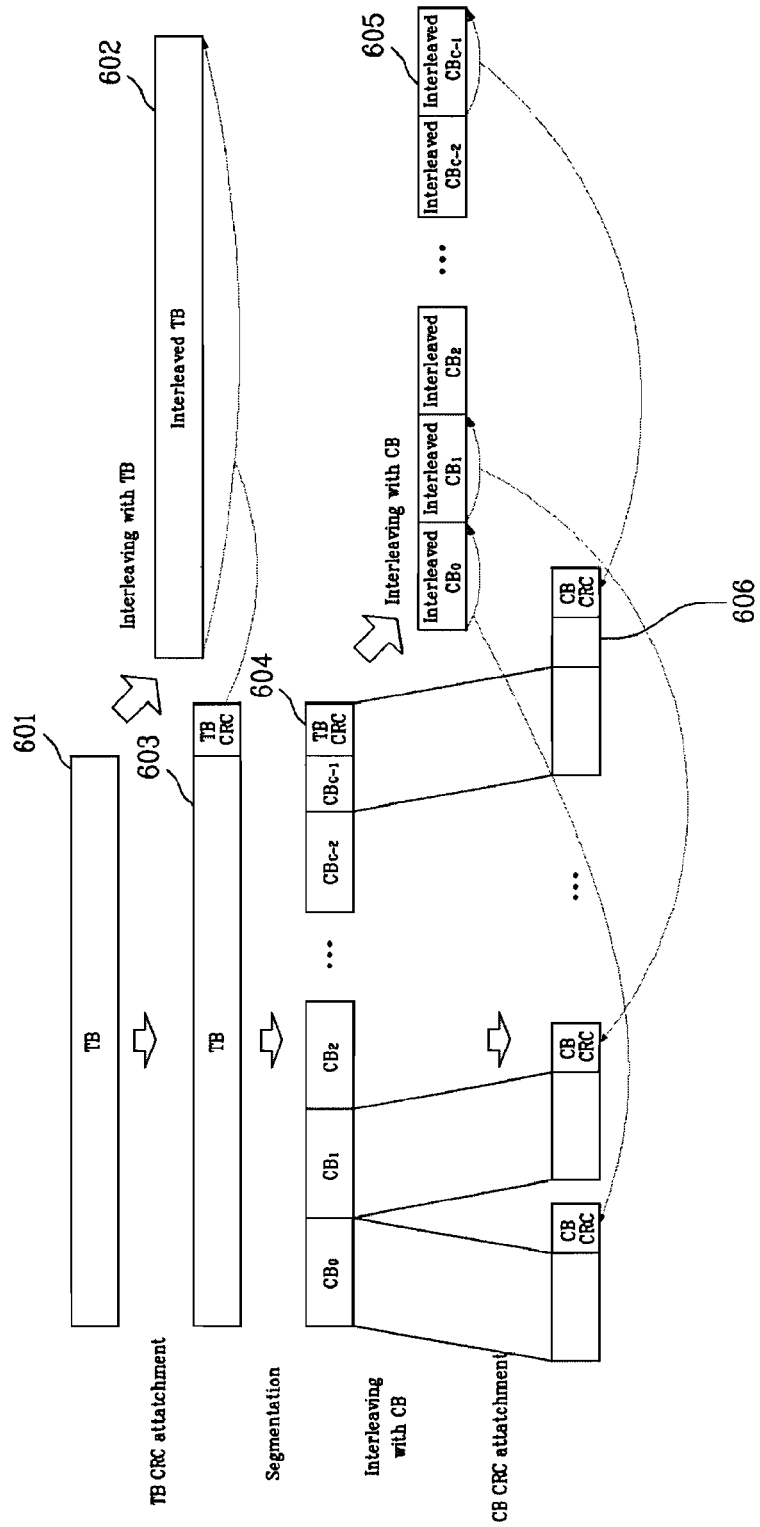
FIGS. 6 and 7 illustrate methods for reducing an undetected error pattern in a transport block and code block in accordance with embodiments of the present invention.
Figure 7:
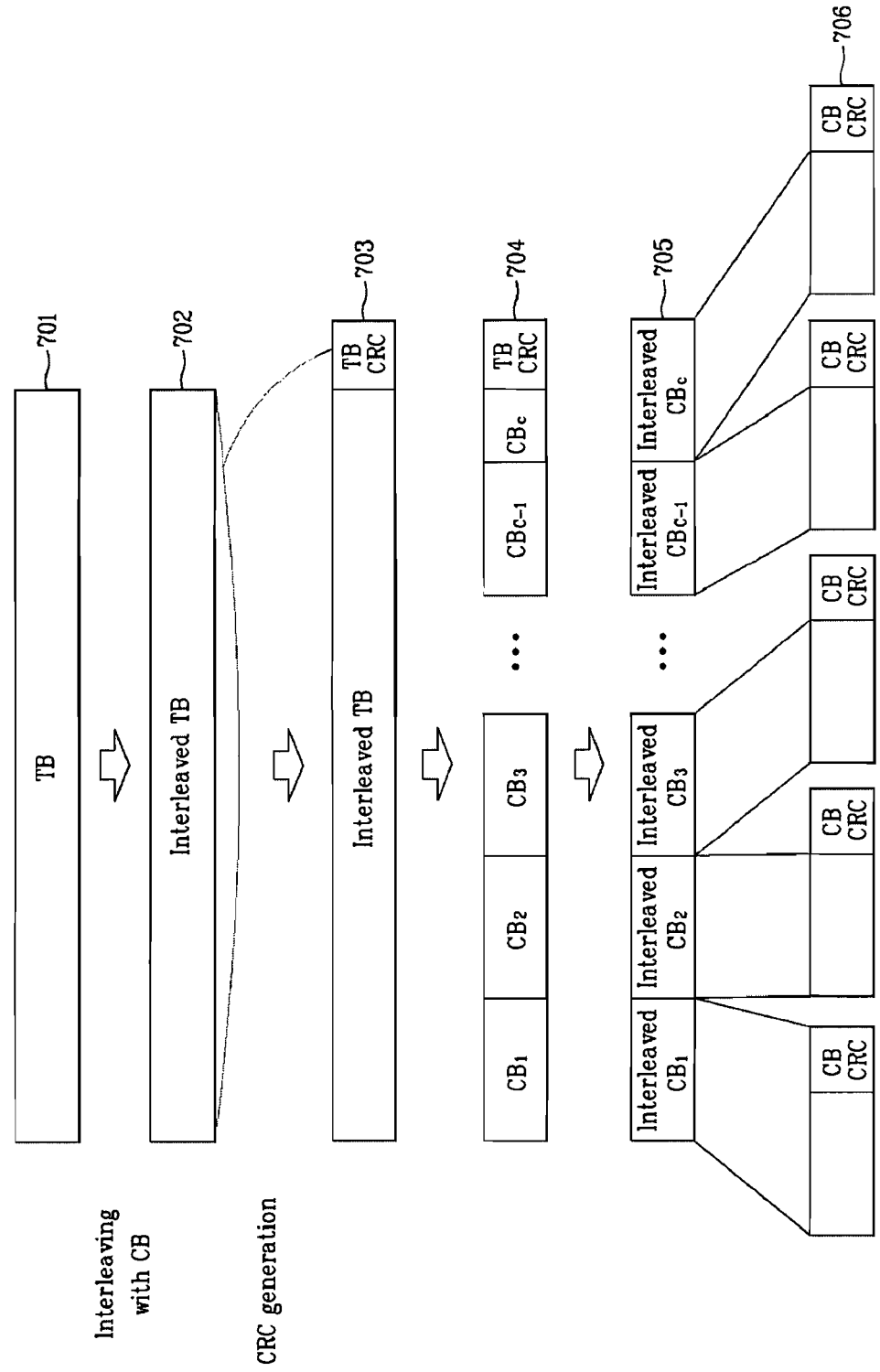

FIGS. 6 and 7 illustrate methods for reducing an undetected error pattern in a transport block and code block in accordance with embodiments of the present invention.

In FIG. 6, transport blocks 601 are received and are interleaved by a first-type interleaving to form a first-type interleaved transport block 602. Thereafter, a first CRC is generated according to an order of the first-type interleaved transport block 602 and is attached to the transport block 601 without interleaving to form a transport block 603 attached with the first CRC.

Thereafter, the transport block 603 attached with the first CRC is segmented into a plurality of code blocks 604 and the respective segmented code blocks are interleaved by a second-type interleaving to form a plurality of second-type interleaved code blocks 605. Thereafter, a second CRC is generated according to an order of the second-type interleaved code blocks 605 and is attached to each code block 604 without interleaving. Therefore, a code block 606 attached with the second CRC is formed.

In accordance with the present invention, the first-type interleaving and the second-type interleaving have different patterns from each other. Accordingly, an undetected error pattern in the CRC added to the transport block is different from undetected error pattern in the CRC attached to the code block.

FIG. 7 illustrates an alternative method for attaining results similar to FIG. 6. In FIG. 7, transport blocks 701 are received and are interleaved by a first-type interleaving to form a first-type interleaved transport block 702. Thereafter, a first CRC is generated according to an order of the first-type interleaved transport block 702 and is attached to the interleaved transport block 702 to form a transport block 703 attached with the first CRC.

Thereafter, the transport block 703 attached with the first CRC is segmented into a plurality of code blocks 704. The respective segmented code blocks 704 are then interleaved by a second-type interleaving to form a plurality of second-type interleaved code blocks 705. Thereafter, a second CRC is generated according to an order of the second-type interleaved code blocks 705 and is attached to each second-type interleaved code block 705 to form code blocks 706 respectively attached with the second CRC.

In accordance with the present invention, another method for solving the problem of the same undetected error pattern being present in both the transport block and code block will be described. For example, when generating the CRC, data may be read in a reverse order when passing through an interleaver of the transport block or code block. Notably, this may be implemented using a simple interleaver form. Preferably, the interleaver used in the transport block is different from the interleaver in the code block. Therefore, a method for generating the CRC comprises data being read in a normal order at one block and read in a reverse order at the other block. As such, the described method of CRC generation may be considered similar to the principle of using CRC generating polynomials having a reciprocal relationship.

Figure 8:
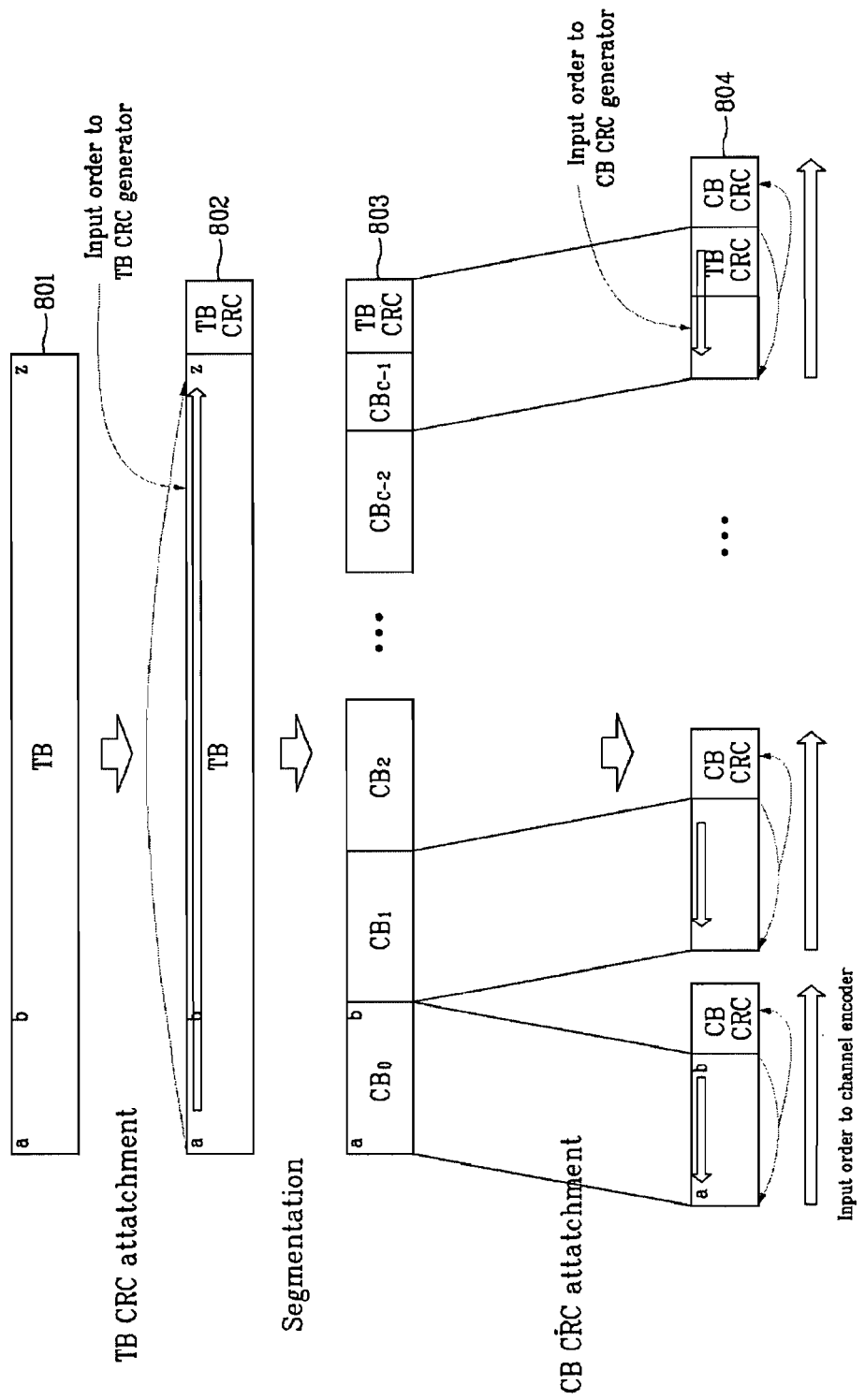
FIG. 8 illustrates a CRC generation method by reading a transport block in a forward direction and reading a code block in a reverse direction in accordance with one embodiment of the present invention.

FIG. 8 illustrates a CRC generation method by reading a transport block in a forward direction and reading a code block in a reverse direction in accordance with one embodiment of the present invention.

Referring to FIG. 8, when the transport block 801 is received, the transport block is read in a forward direction to generate a first CRC. The generated first CRC is then attached to the transport block 801 to form a transport block 802 attached with the first CRC. In accordance with the present invention, reading the transport block in the forward direction comprises sequentially reading the transport block from a reference "a" to a reference "z".

Thereafter, the transport block 802 attached with the first CRC is segmented into a plurality of code blocks 803. A second CRC may be generated by reading the code blocks in a reverse direction (804). The generated second CRC may then be attached to each code block 803. Preferably, reading a code block in a reverse direction comprises reading the code block from a reference "b" to a reference "a" (804). Moreover, as shown in FIG. 8, below the code blocks attached with the second CRC, a direction of how a channel encoder reads the code blocks is shown.

Figure 9:
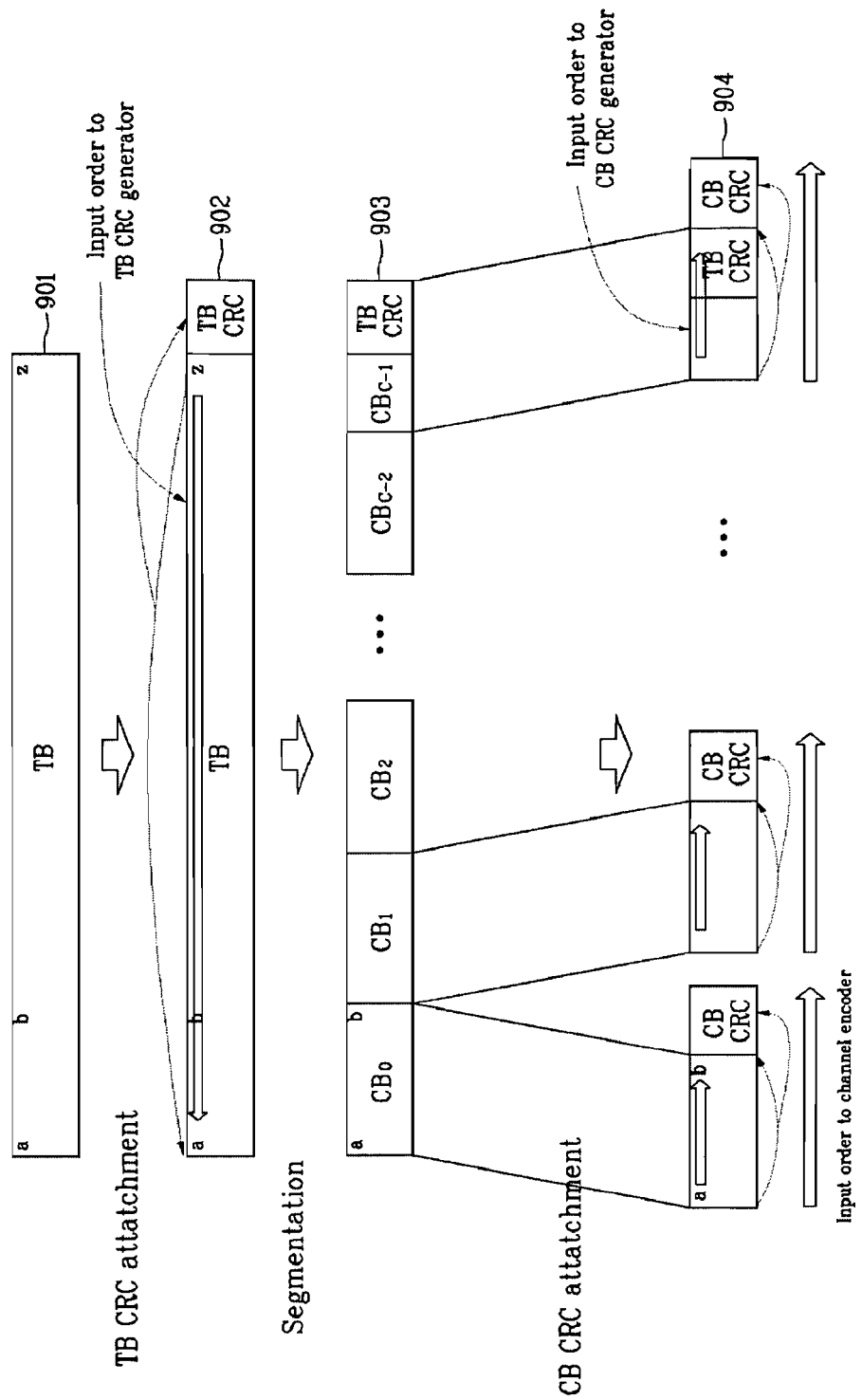
FIG. 9 illustrates a CRC generation method by reading a transport block in a reverse direction and reading a code block in a forward direction in accordance with one embodiment of the present invention.

FIG. 9 illustrates a CRC generation method by reading a transport block in a reverse direction and reading a code block in a forward direction in accordance with one embodiment of the present invention.

Referring to FIG. 9, when the transport block 901 is received, the transport block is read in a reverse direction to generate a first CRC. The generated first CRC is then attached to the transport block 901 to form a transport block 902 attached with the first CRC. In accordance with the present invention, reading the transport block in the reverse direction comprises sequentially reading the transport block from a reference "z" to a reference "a".

Thereafter, the transport block 902 attached with the first CRC is segmented into a plurality of code blocks 903. A second CRC may be generated by reading the code blocks in a forward direction (904). The generated second CRC may then be attached to each code block 903. Preferably, reading a code block in a forward direction comprises reading the code block from a reference "a" to a reference "b" (904). Moreover, as shown in FIG. 9, below the code blocks attached with the second CRC, a direction of how a channel encoder reads the code blocks is shown.

In accordance with the present invention, a case where any one of a transport block CRC and a code block CRC is generated by reading data in reverse order will be explained in more detail. If the CRC is generated by reading the transport block in a forward direction and the code block in a reverse direction, as shown in a structure of FIG. 8, when detecting the CRC of the code block, an information portion (systematic portion or message portion) in the code block is found to be read in a reverse order and then returned to the beginning of the code block to check the CRC portions of the code block. To simplify the structure, it is preferable to reverse the order of the code block and attach the CRC thereto.

Figure 10:
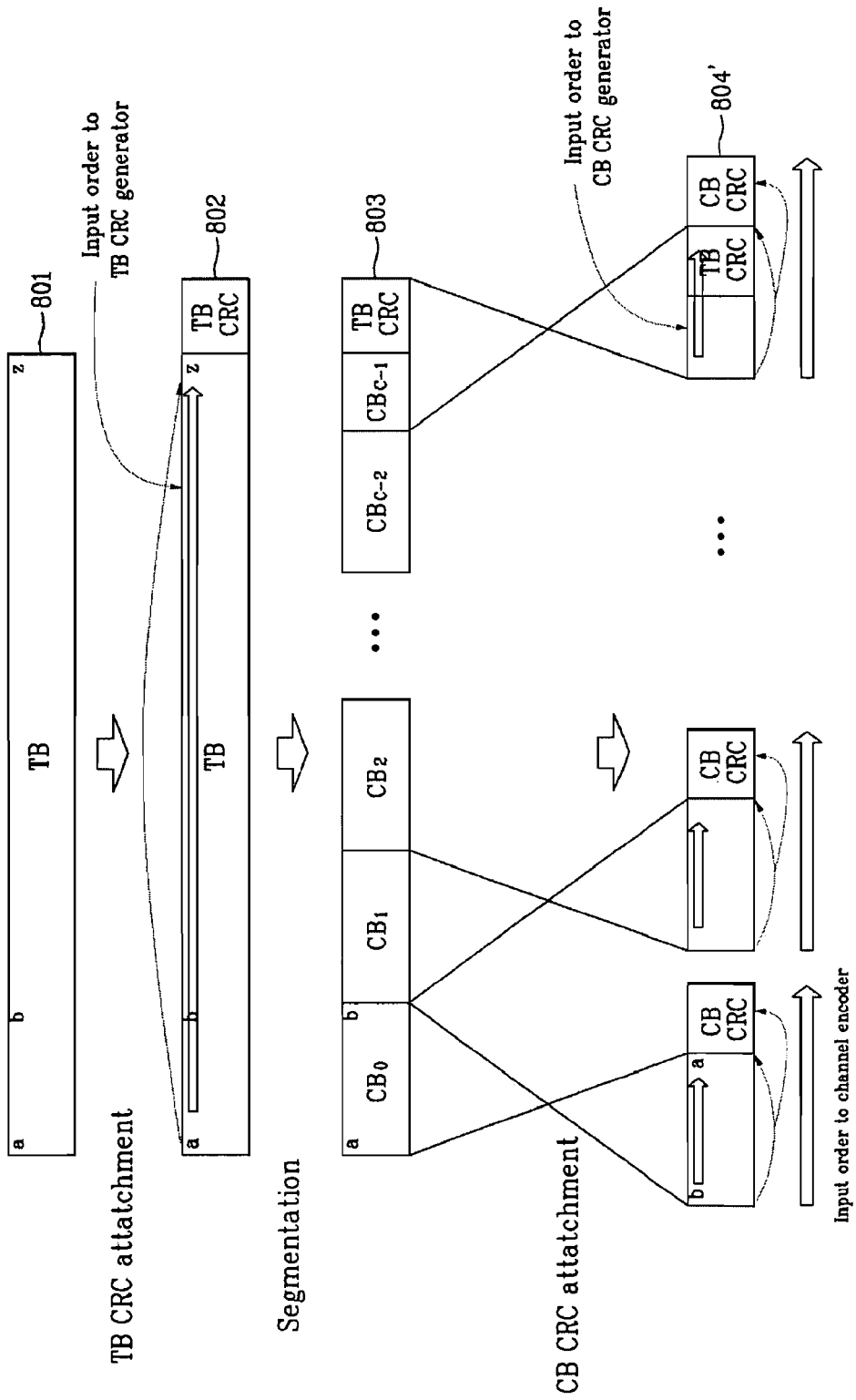
FIG. 10 illustrates a modified example of a CRC attachment method to a code block in a structure of FIG. 8.

FIG. 10 illustrates a modified example of a CRC attachment method to a code block in a structure of FIG. 8. Referring to FIG. 10, code blocks 803 are formed as described in FIG. 8. However, the code blocks 803 are then reversed and a generated second CRC is attached to each code block. For example, the code block $CB_0$, having information sequentially ordered from a reference "a" to a reference "b" is reversed such that the code block $CB_0$, will have information ordered from the reference "b" to the reference "a". Once reversed, the second CRC is attached to form a code block 804' with the second CRC attached.

Accordingly, even when generating the CRC by reading the transport block in a reverse order, as shown in FIG. 9, the code block may be segmented by moving an attachment position of the transport block CRC to a front of an information portion (or message portion) of the transport block. The CRC may then be generated in a forward direction and inputted into the channel encoder. This method is shown in FIG. 11.

Figure 11:
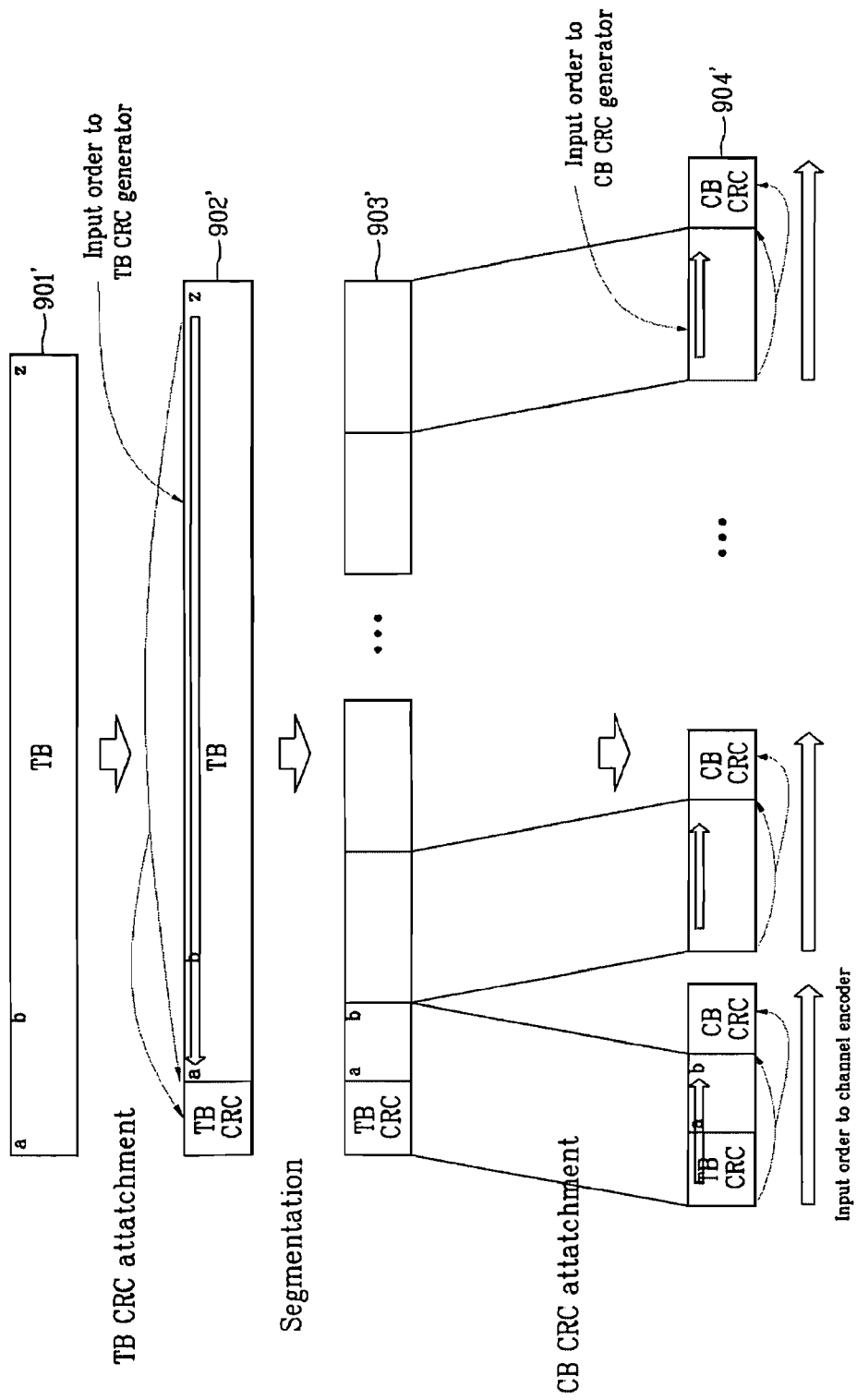
FIG. 11 illustrates a modified example of a CRC attachment method to a transport block in a structure of FIG. 9.

FIG. 11 illustrates a modified example of a CRC attachment method to a transport block in a structure of FIG. 9. Referring to FIG. 11 a transport block 902' to which a first CRC is attached is formed by changing a position of CRC attachment (compared to FIG. 9) when a first CRC is attached to the transport block 901. Other constitutions of the method are the same as those explained in FIG. 9. Therefore, the detailed explanation thereof will be omitted.

In accordance with the present invention, when attaching the CRC to the transport block and/or the code block, a method to attach it in the same direction as the method to attach the CRC in a direction reverse to the CRC generation direction may be implemented. However, for one code block CRC check in attaching the CRC thereto in a reverse direction, there is a disadvantage that the information portion and the CRC portion within the code block should be read in different directions. In order to solve such a disadvantage, it is preferable that a position where the CRC is attached to the code block is moved to a position behind where the information portion of the code block ends, and the recording direction of the CRC is set to be the same direction as the CRC generation direction.

In another embodiment of the present invention, in order to make the reading order of the CRC normal, when generating the CRC in a reverse direction, the recording direction of the CRC may be reversed, and the position thereof becomes the same as that of the normal case. Thus, when generating the CRC by reading the code block in a reverse order, only the recording direction may be changed in attaching the CRC to the code block prior to transmission. In such a case, the recording direction may be changed to attach the CRC to the code block in a reverse order of FIG. 8.

In another embodiment of the present invention, even when the CRC is generated by reading the transport block in a reverse direction, only the recording direction may be changed in attaching the CRC to the code block prior to transmission. In such a case, the recording direction may be changed to attach the CRC to the transport block in a reverse order of FIG. 9.

Hereinafter, examples of embodiments of the present invention will be described, wherein the present invention includes attaching a CRC to a transport block, segmenting the transport block into a plurality of code blocks and attaching a respective CRC to the plurality of code blocks, wherein the CRC for the transport block is set to have a non-detected error pattern different from the CRCs for the code blocks. In one example, the present invention may be applied to a multiple antenna MIMO system.

Figure 12:
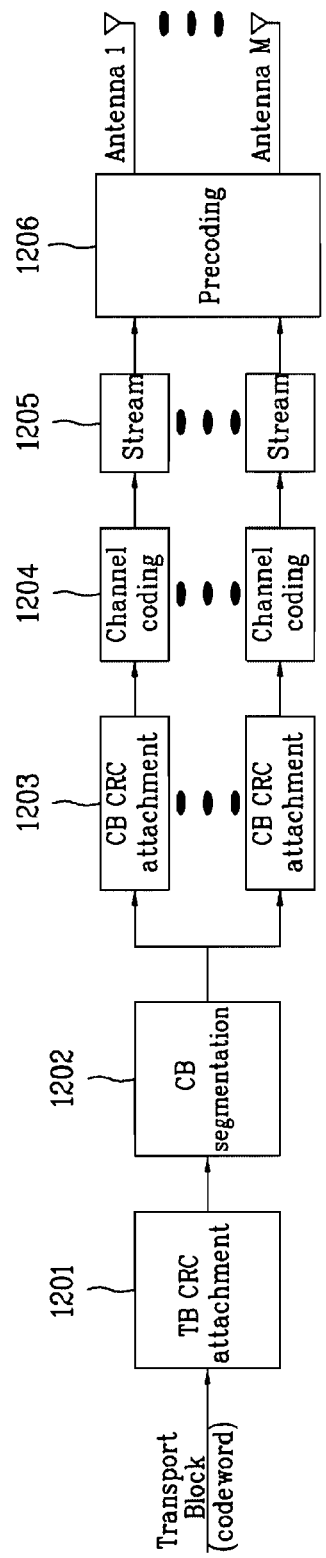
FIG. 12 illustrates an application of the embodiments of the present invention to a multiple antenna system.

FIG. 12 illustrates an application of the embodiments of the present invention to a multiple antenna system. Referring to FIG. 12, a signal may be multiplied in space to simultaneously transmit various streams. Accordingly, if one transport block is segmented into a plurality of code blocks to be transmitted through various streams, and if each code block is transmitted through one stream, then each stream may decode a corresponding code block using the CRC of the code block. Thus, the exactness of all code blocks may be verified using the CRC of the transport block. Consequently, because exact detection in a code block is possible, use of a pre-detected code block for interference cancellation in another stream is made possible.

Still referring to FIG. 12, when receiving a transport block (corresponding to a codeword, for example), a transport block CRC attachment process is first performed (1201). After the transport block CRC is attached, the entire transport block is segmented into a plurality of code blocks (1202). In accordance with the present invention, it is possible to map to each stream in a segmented code block unit, as shown in FIG. 12, rather than map to each stream in a code word unit in a general MIMO system.

Herein, if the number of code blocks C become more than that of the transmissible stream, a plurality of code blocks may be transmitted on one stream.

Meanwhile, if the number of code blocks is not an integer multiple of the stream, a variety of methods may be implemented. In accordance with one method, the number of code blocks is divided by the number of streams to search for a quotient and remainder. Because the quotient indicates the integer multiple of the stream, each of the code blocks is transmitted through each of the streams. Also, because the number of code blocks corresponding to the remainder value is indivisible by the number of streams, any remaining code blocks may be equally divided and transmitted through the streams.

Still referring to FIG. 12, the CRC is attached to each of the code blocks (1203). In accordance with the embodiments of the present invention, the CRC attached to each of the segmented code blocks has an error detection pattern different from the CRC attached to the transport block. The code blocks attached with the CRC are then subjected to a channel encoding process (1204). Afterward, the channel encoded code blocks are mapped to a respective stream for MIMO transmission (1205). Each of the streams may then be transmitted through an antenna via pre-coding (1206).

The detailed description for exemplary embodiments of the present invention disclosed as described above has been provided in order that those skilled in the art can implement and practice the present invention. Although the present invention has been described with reference to the exemplary embodiments, those skilled in the art can understand that the present invention may be variously modified and altered without departing from the scope and the idea of the present invention given in the claims below. Accordingly, the present invention is not intended to be limited to the embodiments given herein but give the widest range conforming to principles and new features disclosed herein.

With a signal segmentation and CRC attachment method for reducing undetected error according to the respective embodiments of the present invention as described above, when attaching the CRC to each of a signal block having a long length and a signal block having a short length, a method for reducing undetected error probability due to both CRCs is realized. Therefore, the method can be applied to a transport block having a long length and a code block having a short length formed by segmentation of the transport block in a 3GPP LTE system. The method can be equally utilized for a scheme attaching a first CRC to a signal block having long length, segmenting the signal block attached with the first CRC, and attaching a second CRC to the segmented signal block in any communication system.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structure described herein as performing the recited function and not only structural equivalents but also equivalent structures.

What is claimed is:

1. A method for a transmitter to transmit signals to a receiver, the method comprising:

attaching a first type CRC (Cyclic Redundancy Check) having a length 'L' to a first type signal block having a length 'A' to produce a sequence having a length 'B', wherein 'B=A+L';

acquiring at least one second type signal block by segmenting the sequence having the length 'B';

attaching each of second type CRCs having the length 'L' to each of the at least one second type signal block;

channel coding the at least one second type signal block; and transmitting the at least one channel coded-second type signal block to the receiver, wherein:

the first type CRC and the second type CRC are generated by using different types of CRC generation polynomials;

segmenting the sequence having the length 'B' comprises determining a number 'C' of the at least one second type signal block to be acquired by the segmenting, considering the length 'L' of each of the second type CRCs to be attached to each of the at least one second type signal block; and one second type signal block is a unit for the channel coding.

2. The method of claim 1, wherein the first type signal block is a transport block (TB) and the second type signal block is a code block (CB).

3. The method of claim 1, wherein the length 'L' is 24 bits.

4. The method of claim 3, wherein the different types of CRC generation polynomials are expressed as 24th order polynomial equations.

5. The method of claim 1, wherein transmitting the at least one channel coded-second type signal block comprises:

mapping signals of the at least one channel coded-second type signal block to one or more streams;

precoding the stream-mapped signals to map to one or more antennas; and transmitting the precoded-signals to the receiver.

6. The method of claim 1, wherein 'C' is determined as:

$$C=[B/(Z-L)]$$

where 'Z' is a predetermined length.

7. A transmitter configured to transmit signals to a receiver, the transmitter comprising:

a first type CRC (Cyclic Redundancy Check) attachment module configured to attach a first type CRC having a length 'L' to a first type signal block having a length 'A' to produce a sequence having a length 'B', wherein 'B=A+L';

a segmentation module configured to acquire at least one second type signal block by segmenting the sequence having the length T, wherein each of second type CRCs having the length 'L' is attached to each of the at least one second type signal block;
a channel coding module configured to perform channel coding the at least one second type signal block; and
a transmission antenna used for transmitting the at least one channel coded-second type signal block to the receiver, wherein:
the first type CRC and the second type CRC are generated by using different types of CRC generation polynomials;
the segmentation module determines a number 'C' of the at least one second type signal block to be acquired by the segmenting, considering the length 'L' of each of the second type CRCs to be attached to each of the at least one second type signal block; and
one second type signal block is a unit for the channel coding.

8. The transmitter of claim 7, wherein the first type signal block is a transport block (TB) and the second type signal block is a code block (CB).

9. The transmitter of claim 7, wherein the length 'L' is 24 bits.

10. The transmitter of claim 9, wherein the different types of CRC generation polynomials are expressed as 24th order polynomial equations.

11. The transmitter of claim 7, further comprising:
a mapper configured to map signals of the at least one channel coded-second type signal block to one or more streams;
a precoder configured to precode the stream-mapped signals to map to the transmission antenna.

12. The transmitter of claim 7, wherein 'C' is determined as:

$$C=\lceil B/(Z-L)\rceil$$

where 'Z' is a predetermined length.

* * * * *